United States Patent
Perry et al.

(10) Patent No.: US 7,304,876 B2
(45) Date of Patent: *Dec. 4, 2007

(54) COMPARE CIRCUIT FOR A CONTENT ADDRESSABLE MEMORY CELL

(75) Inventors: Douglas Perry, Thornhill (CA); Peter Gillingham, Kanata (CA)

(73) Assignee: Mosaid Technologies Incorporated, Kanata, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 11/534,873

(22) Filed: Sep. 25, 2006

(65) Prior Publication Data

US 2007/0014139 A1   Jan. 18, 2007

Related U.S. Application Data

(63) Continuation of application No. 10/856,783, filed on Jun. 1, 2004, now Pat. No. 7,120,040.

(51) Int. Cl.
*G11C 15/00* (2006.01)

(52) U.S. Cl. ............... 365/49; 365/154; 365/189.07

(58) Field of Classification Search ............ 365/49, 365/154, 189.07, 168, 189.11
See application file for complete search history.

(56) References Cited

U.S. PATENT DOCUMENTS

| | | | |
|---|---|---|---|
| 5,598,115 A * | 1/1997 | Holst | 326/119 |
| 5,949,696 A | 9/1999 | Threewitt | |
| 6,044,005 A | 3/2000 | Gibson et al. | |
| 6,154,384 A | 11/2000 | Nataraj et al. | |
| 6,181,591 B1 * | 1/2001 | Miyatake et al. | 365/49 |
| 6,262,907 B1 * | 7/2001 | Lien et al. | 365/49 |
| 6,320,777 B1 | 11/2001 | Lines et al. | |
| 6,370,052 B1 | 4/2002 | Hsu et al. | |
| 6,418,042 B1 | 7/2002 | Srinivasan et al. | |
| 6,483,733 B2 | 11/2002 | Lines et al. | |
| 6,584,003 B1 | 6/2003 | Kim et al. | |
| 6,661,687 B1 * | 12/2003 | Lien et al. | 365/49 |
| 6,744,688 B2 * | 6/2004 | Gillingham et al. | 365/227 |
| 7,120,040 B2 * | 10/2006 | Perry et al. | 365/49 |

OTHER PUBLICATIONS

Schultz, "Content-addressable memory core cells A survey", INTEGRATION, the VLSI Journal 23, 1997, pp. 171-188.

* cited by examiner

*Primary Examiner*—Gene N. Auduong
(74) *Attorney, Agent, or Firm*—Shin Hung; Borden Ladner Gervais LLP

(57) ABSTRACT

A ternary content addressable memory (CAM) cell is disclosed for providing reduced or minimized matchline (ML) capacitance and for increasing current between matchline and tail-line in the case of a mismatch. The speed of a CAM cell is generally inversely proportional to its ML capacitance, and proportional to the current. Conventional ternary CAM cells have many matchline transistors, each contributing to the matchline capacitance. Embodiments of the present invention have a single matchline transistor between a matchline and a ground line, or tail-line, of the CAM cell. The single matchline transistor couples the matchline to the tail-line in response to a discharge signal from a compare circuit. The compare circuit can be divided into a pull-up section for driving a gate voltage level control node and a discharge section for discharging the gate voltage level control node, the discharge signal being provided at the gate voltage level control node.

36 Claims, 7 Drawing Sheets

COMPARE CIRCUIT FOR A CONTENT ADDRESSABLE MEMORY CELL

CROSS REFERENCE TO RELATED APPLICATIONS

The present application is a continuation of U.S. patent application Ser. No. 10/856,783, filed on Jun. 1, 2004, now U.S. Pat No. 7,120,040.

FIELD OF THE INVENTION

The present invention relates generally to content addressable memory. More particularly, the present invention relates to the design of a high-speed, low-power memory cell for content addressable memory.

BACKGROUND OF THE INVENTION

In conventional memory systems, such as random access memory (RAM), binary digits (bits) are stored in memory cells, and are accessed by a processor that specifies a linear address associated with the accessed location. To ensure proper processor control, each operation that accesses memory must declare, as a part of an access instruction, the address of the memory cell/cells. Conventional memory systems are not well designed for a content based search. Content based searches in conventional RAMs require a software based algorithmic search, controlled by a microprocessor. Many memory access operations are required to perform a search. For this reason, searches in conventional RAMs are neither quick nor efficient in using processor resources.

To overcome these inadequacies, an associative memory system called Content Addressable Memory (CAM) has been developed. CAM allows cells to be referenced by their contents. Thanks to this feature, CAMs have first found use in lookup table implementations such as cache memory subsystems and are now rapidly finding use in networking systems. CAM's most valuable feature is its ability to perform a search on multiple locations as a single operation, in which searched data (also referred to as a "search key") is compared to data stored within the CAM. Typically, a search key is loaded onto search lines and compared to words stored in CAM. During a search operation, a match or mismatch signal associated with each stored word is generated on a matchline, indicating whether the search key matches a stored word or not.

CAM stores data in an array of cells, which are generally either SRAM based cells or DRAM based cells. Until recently, SRAM based CAM cells have been most common because of their simpler implementation. However, SRAM based cells require more transistors than DRAM based cells. As a result, SRAM based CAMs have much lower packing density than DRAM based CAMs.

A typical CAM block diagram is shown in FIG. 1. The CAM 10 includes a memory array 25, of CAM cells (not shown) arranged in rows and columns. A predetermined number of CAM cells in a row store a word of data. An address decoder 17 is used to select any row within the CAM array 25 to allow data to be written into or read out of the selected row. Data access circuitry such as bitlines, column selection devices, and wordline drivers, are located within the array 25 to transfer data into and out of the array 25. Located next to CAM array 25 for each row of CAM cells are matchline sense circuits (not shown), which are used during search operations for outputting a result indicating a successful or unsuccessful match of a search key against the word stored in the row. The results for all rows are processed by a priority encoder 22 to output the address (Match Address) corresponding to the location of a matched word. The match addresses are stored in match address registers 18 before being output by a match address output block 19. Data is written into array 25 through a data I/O block 11 and various data registers 15. Data is read out from the array 25 through data output register 23 and the data I/O block 11. Other components of the CAM include a control circuit block 12, flag logic block 13, various control and address registers 16, and refresh counter 20. A JTAG block and voltage supply generation block can optionally be used in conjunction with FIG. 1, as would be apparent to one skilled in the art.

FIG. 2 depicts a hierarchical view of the typical CAM array 25. CAM array 25 includes CAM cells 30 and a matchline sense circuit block 26. CAM cells 30 of the CAM array 25 are arranged in rows and columns. CAM cells 30 of a row are connected to a common matchline MLi, word line WLi and ground line, or tail line, TLi; CAM cells 30 of a column are connected to a common pair of search lines SLjb/SLj and a common pair of bitlines BLj/BLjb, where i is an integer value between 0 and n, and j is an integer value between 0 and m. Located next to the CAM array 25 for each row is matchline sense circuit block 26. Matchline sense circuit block 26 includes one matchline sense circuit 27 connected to a respective matchline MLi and tail line TLi. Both MLi and TLi are used during search operations for outputting match signals ML_OUT0 through ML_OUTn indicating a successful or unsuccessful match of a search key against the stored word. Matchlines MLi and tail lines TLi are connected to their respective matchline sense circuits 27, and tail lines TLi for some implementations can be selectively or permanently connected to ground. Although not shown, the matchline sense circuits 27 also receive control signals to control their operation, and a person skilled in the art would understand that such control signals are necessary for proper operation of the circuit. As the matchlines and tail lines connect to each CAM cell in the row, mismatch in a majority of cells in the same row will result in faster change of voltage difference between MLi and TLi. Mismatch in only a few CAM cells will drain less current and result in a much slower voltage difference change.

There is a number of known CAM cell schemes. A good source that includes a description of a few such schemes is "Content Addressable Memory Core Cells. A survey" by Kenneth J. Schultz published in the VLSI journal of INTEGRATION 23 (1997) pp. 171-188, the contents of which are incorporated herein by reference. The most relevant, yet quite different, scheme considered among such prior art schemes is shown in FIG. 3A. This scheme is a typical ternary DRAM based CAM cell 30 as described in U.S. Pat. No. 6,320,777 issued on Nov. 20, 2001, the contents of which are also incorporated herein by reference. Cell 30 has a comparison circuit which includes an n-channel search transistor 31 connected in series with an n-channel compare transistor 32 between a matchline ML and a tail line TL. A search line SLb is connected to the gate of search transistor 31. The storage circuit includes an n-channel access transistor 33 having its gate connected to wordline WL and connected in series with capacitor 34 between bitline BL and a cell plate voltage potential VCP. Charge storage node CELL1 is connected to the gate of compare transistor 32 to turn the transistor 32 on or off depending on charge stored in capacitor 34 i.e. if CELL1 is logic "1" or logic "0". The remaining transistors and capacitor replicate transistors 31, 32, 33 and capacitor 34 for the other half of the ternary data bit, and are connected to corresponding lines SL and BLb and are provided to support ternary data storage. Together they can store a ternary value representing logic "1", logic "0", or "don't care", as shown in Table 1.

TABLE 1

| Ternary Value | CELL 1 | CELL 2 |
|---|---|---|
| 0 | 0 | 1 |
| 1 | 1 | 0 |
| "Don't Care" | 0 | 0 |

In some matchline sensing schemes of the prior art, each matchline is initially precharged high to the full $V_{DD}$ supply. A matchline will be discharged to ground through channels of transistors 31, 32 if the contents of its stored word do not match, i.e. mismatch, the search key, but will remain at the $V_{DD}$ level if the stored word matches the search key. Each matchline voltage level is sensed by a matchline sensing circuit which generates a result of the comparison of matchline voltage level to a reference voltage level. Other variations of sensing schemes are also known. However, in general, the matchline voltage level changes when a mismatch occurs, since it will be discharged to ground or $V_{DD}$ level. In the case of a match, the matchline is not discharged, and the matchline voltage level does not change.

The tail line TL is typically connected to ground. Because n-channel transistors have higher efficiency, all the transistors tend to be n-channel rather then p-channel. The description of the operation of the ternary DRAM cell is detailed in the aforementioned issued U.S. Pat. No. 6,320,777.

FIG. 3B illustrates a traditional SRAM-based ternary CAM cell. Two memory cells, SRAM Cell 1 and SRAM Cell 2, are provided on the P side and Q side, respectively of the ternary CAM cell. The SRAM Cell 1 provides as an output at a node thereof a signal SNP, which in FIG. 3B is provided to the gate of transistor M2. The SRAM Cell 2 provides as an output at a node thereof a signal SNQ, which in FIG. 3B is provided to the gate of transistor M4. Transistors M1 and M2 are connected in series between ML and TL and are used to perform search operations relating to the SRAM Cell 1 on the P side. Transistors M3 and M4 are connected in series between ML and TL and are used to perform search operations relating to the SRAM Cell 2 on the Q side. Transistor pairs M1, M2 and M3, M4 constitute two so called search stacks—each pair being provided as a search stack for the P and Q side, respectively.

The cell in FIG. 3B operates as follows. Information is stored in the cell according to Table 2 below. Note that data is encoded as shown in the table for proper operation of the search stacks.

TABLE 2

Truth Table for Ternary Data for CAM cell in FIG. 3B

| Data | SNP | SNQ | SLP | SLQ |
|---|---|---|---|---|
| 0 | 0 | 1 | 1 | 0 |
| 1 | 1 | 0 | 0 | 1 |
| "Don't Care" | 0 | 0 | 0 | 0 |

Prior to a search operation, data has been written into CAM cell using well known and understood techniques. A search is initiated by placing the search key information onto the searchlines (SL). The cell is arranged such that when the comparison between the stored data and the search data results in a match, neither side of the cell (P side or Q side) produces a conductive path between the matchline (ML) and tail-line (TL), via M1 and M2, or M3 and M4. However if there is a mismatch, then at least one search stack of the cell will be conductive and will cause the ML voltage to equalize to the TL voltage level. The sensing scheme can be built in many different ways, and its main function is determining whether or not there is a match between stored data and the search key, and providing conductive path between the ML and TL in case of mismatch. The more CAM cells one places on a single ML, the denser is the CAM as less sense-amplifiers are required. However, performance can suffer due to accumulated parasitic capacitance that increases proportionally with the number of cells on the same ML.

One of the great challenges in the design of an integrated CAM is dealing with large capacitance of the MLs during a search operation. This poses problems in three areas. First, the speed of the search operation is generally limited to how fast the ML voltage level can change when it is sensed to indicate whether or not a conductive path is present. This speed is proportional to the value of ML parasitic capacitance and the current of the conductive path between matchline and tail line. Time t needed for ML to TL voltage to develop voltage difference of V volts with capacitance between ML and TL of C and the conductive path current I is given by $t=CV/I$. It is possible to reduce the ML capacitance by segmenting the matchline into smaller sections, as described in U.S. Pat. No. 6,584,003 issued on Jun. 24, 2003 to Kim et al., which is incorporated by reference herein. However, this ML capacitance reduction comes at the expense of silicon area due to the additional sense circuitry required. Second, the approximate power budget during a search operation can be expected to be about 40% SL power, 40% ML power and 20% power of peripheral circuitry. Note that search operation power is far and away the largest dynamic power consumption for a CAM chip. Since ML power is proportional to $CV^2f$, any reduction in ML capacitance will directly reduce matchline portion of the search power consumption. Third, as all matchline sense amplifiers are activated simultaneously during search operation, a huge power spike is produced. This can be particularly problematic since it can cause significant power rail noise or even power grid collapse.

The ML capacitance has contributions from each of the following components: the wire capacitance of the ML; and source and drain capacitance of M1, M2, M3 and M4, which in turn each consist of a number of components. The latter will also change depending on what data pattern is applied as a search key. In fact it has been found that the worst case ML capacitance occurs when one of the search lines is high.

CAM cells are known with as many as two transistors directly connected to matchline, each transistor contributing to matchline capacitance, as described above. Up to four transistors are typically provided in two search stacks, one for each side of the memory cell. Such CAM cells are described, for example, in the following three references: U.S. Pat. No. 6,483,733 issued to V. Lines et al. (Mosaid Technologies Inc.) on Nov. 19, 2002; U.S. Pat. No. 5,949,696 issued to N. B. Threewitt (Cypress Semiconductor Corporation) on Sep. 7, 1999; and U.S. Pat. No. 6,418,042 issued to Srinivasan et al. (NetLogic Microsystems, Inc.) on Jul. 9, 2002.

U.S. Pat. No. 6,154,384 issued to Nataraj et al. (NetLogic Microsystems, Inc.) on Nov. 28, 2000 describes a ternary content addressable memory cell, which includes a first memory cell, a compare circuit, a second memory cell and a mask circuit. The compare circuit of the '384 patent does not use four transistors in two stacks, as in the patents mentioned earlier. Rather, it includes three transistors that perform the comparison function, thereby reducing the matchline capacitance somewhat. However, there is a need for reducing the matchline capacitance even further, in order to improve speed and reduce power consumption and noise.

It is, therefore, desirable to provide a ternary CAM cell that provides reduced matchline capacitance and increased current for the conductive path between matchline and tail line.

SUMMARY OF THE INVENTION

It is an object of the present invention to obviate or mitigate at least one disadvantage of previous ternary CAM cells.

The purpose of this invention is to provide an improved ternary CAM cell which results in at least one of lower matchline capacitance and bigger conductive path current. This in turn translates into higher speed, lower power and lower noise for CAM integrated circuits.

This invention will describe some circuit techniques to reduce the capacitance of matchlines and increase the conductive path current. Improved speed and reduced power of the IC will be directly proportional to these improvements.

It is an important goal of any memory design including CAM that cell size (transistor count and geometry) is kept minimum necessary for providing efficient silicon area utilisation. Embodiments of the present invention introduce some novel cell schemes that involve higher transistor count compare to known schemes, but reduce the ML capacitance and increase the conductive path current significantly. This in turn results in better search performance, thus requiring less support circuitry and enabling lower power, higher speed operation.

In a first aspect, the present invention provides a ternary content addressable memory (CAM) cell having bit lines, first and second search lines, a word line, a matchline, a tail-line, and first and second memory cells. The content addressable memory cell includes a compare circuit for receiving stored data from the first and second memory cells, and for receiving search data from the search lines. The compare circuit performs a comparison of the stored data and the search data in response to the search data, and provides a discharge signal when the comparison results in a mismatch condition. The content addressable memory cell also includes a single matchline transistor for coupling the matchline to the tail-line in response to the discharge signal.

The compare circuit can include a pull-up section for driving a gate voltage level control node, and a discharge section for discharging the gate voltage level control node, the discharge signal being provided at the gate voltage level control node. The single matchline transistor can have a gate terminal coupled to the gate voltage level control node for receiving the discharge signal.

The single matchline transistor can be n-type and have a drain terminal coupled to the matchline, and a source terminal coupled to the tail-line. Many embodiments are discussed with respect to this situation.

In an embodiment, the pull-up section can include first and second n-type pull-up transistors, the first n-type pull-up transistor for coupling the first search line to the gate voltage level control node, and the second n-type pull-up transistor for coupling the second search line to the gate voltage level control node. The first n-type pull-up transistor can have a gate terminal for receiving stored data from the first memory cell, and the second n-type pull-up transistor can have a gate terminal for receiving stored data from the second memory cell. The discharge section can include first and second n-type discharge transistors connected to each other in series between the gate voltage level control node and a voltage supply, such as ground or $V_{SS}$. In that case, the first n-type discharge transistor can have a gate terminal for receiving stored data from the first memory cell, and the second n-type discharge transistor can have a gate terminal for receiving stored data from the second memory cell.

In another embodiment, the pull-up section can include a pull-up search stack having two branches, each branch for coupling the gate voltage level control node to a voltage supply. Each branch can include a pair of serially connected p-type transistors, where one branch receives, at gate terminals of the p-type transistors, data from the first search line and stored data from the first memory cell, and the other branch receives, at gate terminals of the p-type transistors, data from the second search line and stored data from the second memory cell.

In a further embodiment, the pull-up section can further include a pull-up pre-charge transistor for coupling the voltage supply to the pull-up search stack in response to a pre-charge signal.

In a still further embodiment, the discharge section can include a discharge search stack having two branches, each branch for coupling the gate voltage level control node to a voltage supply. Each branch can include a pair of serially connected n-type transistors, where one branch receives, at gate terminals of the n-type transistors, data from the second search line and stored data from the first memory cell, and the other branch receives, at gate terminals of the n-type transistors, data from the first search line and stored data from the second memory cell.

In another embodiment, the discharge section can include a single discharge transistor for coupling the gate voltage level control node to a voltage supply, such as ground or $V_{SS}$, in response to a pre-charge signal.

In a further embodiment, the single matchline transistor can be p-type and have a gate terminal coupled to the gate voltage level control node for receiving the discharge signal. The pull-up section can include first and second p-type pull-up transistors connected to each other in series between the gate voltage level control node and a voltage supply. The first p-type pull-up transistor can have a gate terminal for receiving stored data from the first memory cell, and the second p-type pull-up transistor can have a gate terminal for receiving stored data from the second memory cell. The discharge section can include first and second p-type discharge transistors, the first p-type discharge transistor for coupling the first search line to the gate voltage level control node, and the second p-type discharge transistor for coupling the second search line to the gate voltage level control node. The first p-type discharge transistor can have a gate terminal for receiving stored data from the first memory cell, and the second p-type discharge transistor has a gate terminal for receiving stored data from the second memory cell.

The first and second memory cells can be SRAM cells, or DRAM cells.

In another aspect, the present invention provides a ternary content addressable memory cell having a matchline, the CAM cell including: a compare circuit for providing a comparison result signal in response to a comparison between stored data and search data; and a single transistor for coupling the matchline to a discharge node in response to the comparison result signal being asserted.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION OF THE INVENTION

Figure 1:
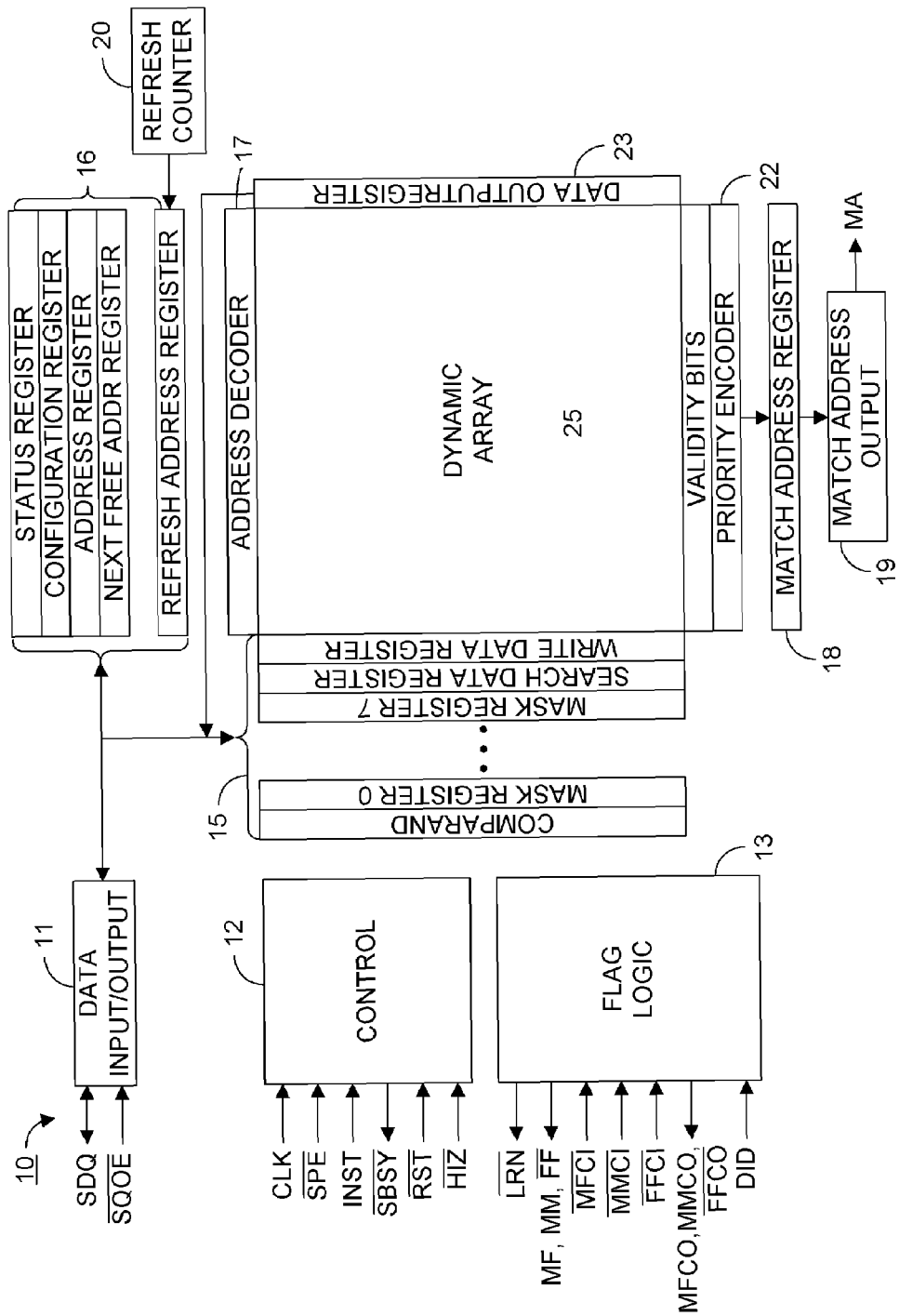
FIG. 1 illustrates a block diagram of a typical CAM.

Generally, the present invention provides a ternary content addressable memory (CAM) cell for providing reduced or minimized matchline (ML) capacitance and increasing current between matchline and tail-line in the case of a mismatch. The speed of a CAM cell is generally inversely proportional to its ML capacitance, and proportional to the current. Conventional ternary CAM cells have many, typically four, matchline transistors, each contributing to the matchline capacitance. Ternary CAM cells according to embodiments of the present invention have a single matchline transistor between a matchline and a ground line, or tail-line, of the CAM cell. The single matchline transistor couples the matchline to the tail-line in response to a discharge signal from a compare circuit. The compare circuit can be divided into a pull-up section for driving a gate voltage level control node and a discharge section for discharging the gate voltage level control node, the discharge signal being provided at the gate voltage level control node. Embodiments are provided with different transistor configurations for each section, each having different characteristics.

In this description, the terms n-type, n-channel and NMOS will be used interchangeably. Similarly, the terms p-type, p-channel and PMOS will be used interchangeably. The term tail line will be used herein to represent a ground line or tail line, as known to those of skill in the art.

In this description, the P side and Q side of a CAM cell will be referred to as a first memory cell and a second memory cell, respectively. SLP will be used to herein represent data from a first search line, and SLPb will be used herein to represent a complement of data from the first search line. SNP will be used to represent stored data from the first memory cell, and SNPb will be used to represent a complement of stored data from the first memory cell. SLQ will be used to herein represent data from a second search line, and SLQb will be used herein to represent a complement of data from the second search line. SNQ will be used to represent stored data from the second memory cell, and SNQb will be used to represent a complement of stored data from the second memory cell. Each of these labels is shown in the figures, and described in relation thereto. The terms "gate voltage level control node" and "node NX" (or "NX node") will be used interchangeably herein to represent a CAM cell internal node controlling a gate voltage level of the matchline transistor. This node can alternatively be referred to as an output node, since it provides an output to be used internally by the CAM cell. The term $V_{SS}$ will be used to represent a ground node, ground rail, or simply an electrical ground. The term $V_{DD}$ will be used to represent a power supply voltage, a power supply node, a power supply rail, or simply a power rail.

Embodiments of the present invention provide a ternary content addressable memory cell having a matchline. The CAM cell includes a compare circuit for providing a comparison result signal in response to a comparison between stored data and search data. The CAM cell also includes a single transistor for coupling the matchline to a discharge node in response to the comparison result signal being asserted.

Figure 4:
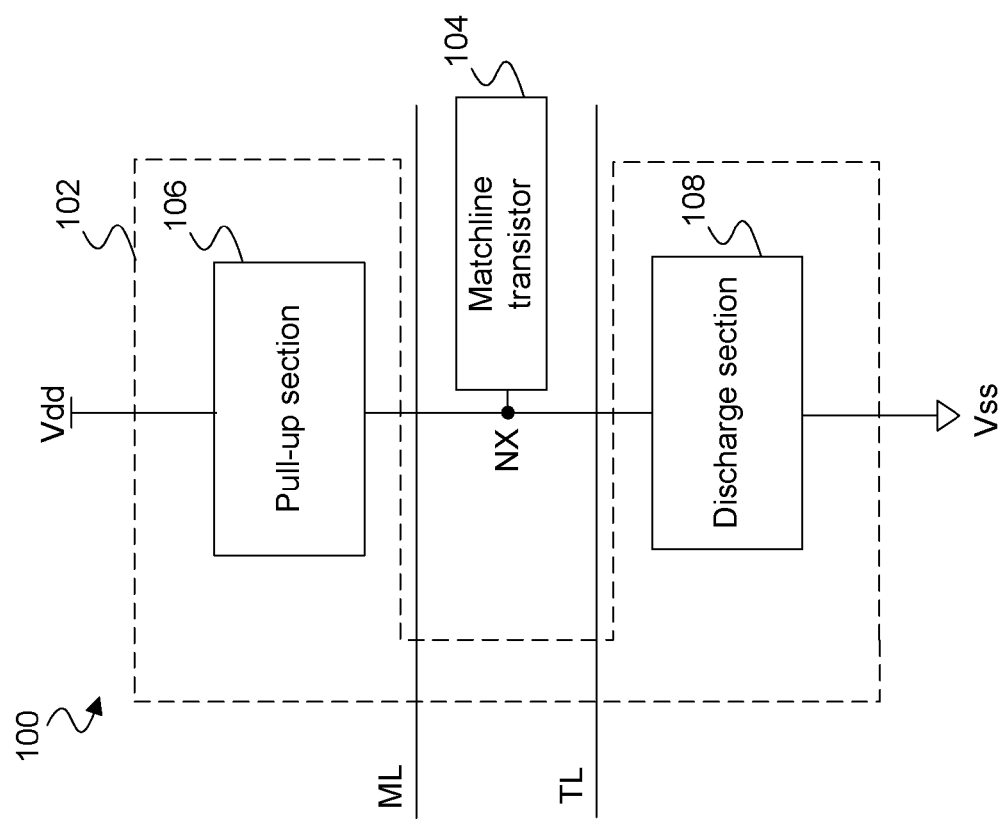
FIG. 4 illustrates a block diagram of a ternary CAM cell having reduced ML capacitance according to an embodiment of the present invention.

FIG. 4 illustrates a block diagram of a ternary CAM cell having reduced ML capacitance according to an embodiment of the present invention. In FIG. 4, the memory cell circuits have been omitted in order to simplify the representation of the ternary CAM cell. However, one skilled in the art can readily understand the necessary connections. Such connections will also be described in relation to FIG. 5. In FIG. 4, a ternary CAM cell 100 according to an embodiment of the present invention is provided, having a search and compare circuit 102 and a single matchline transistor 104. The single matchline transistor is coupled between the matchline ML and the tail-line TL. The tail-line TL in all embodiments discussed herein can be provided as a separate line; alternatively it can be connected to ground or $V_{DD}$. The single matchline transistor 104 has its gate connected to a node NX.

The search and compare circuit 102 provides both search and compare functionality, and is coupled to a gate voltage level control node, shown as node NX in FIG. 4, as well as to $V_{DD}$ and $V_{SS}$, as illustrated. The search and compare circuit 102 can be described as a control circuit, or a logic circuit, that controls activation of the matchline transistor 104. In other words, the compare circuit 102 provides a discharge signal for controlling the matchline transistor based on the presence of a match or a mismatch. As described earlier, in general a matchline voltage level changes when a mismatch occurs, since the matchline transistor will be turned on in the case of a mismatch. Therefore, in the case of a mismatch condition, the compare circuit 102 provides a discharge signal to the gate of the matchline transistor 104. The discharge signal can be provided as a high signal for an n-type transistor 104, and as a low signal (i.e. ground) for a p-type transistor 104. In the case of a match, the matchline is not equalised to tail line, and the matchline voltage level does not change. This applies to all embodiments discussed herein.

In other words, the present invention provides a ternary content addressable memory (CAM) cell having bit lines, first and second search lines, a word line, a matchline, a tail-line, and first and second memory cells. The content addressable memory cell includes a compare circuit for receiving stored data from the first and second memory cells, and for receiving search data from the search lines. The compare circuit performs a comparison of the stored data and the search data in response to the search data, and provides a discharge signal when the comparison results in a mismatch condition. The content addressable memory cell also includes a single matchline transistor for coupling a voltage of the matchline to the tail-line in response to the discharge signal.

Preferably, the search and compare circuit 102 includes a pull-up section 106 and a discharge section 108. Typically, CAM cells do not include both a discharge and a pull-up section, i.e. the elements are all discharge elements. In general, and under appropriate conditions, the pull-up section pulls up the node NX to the positive supply voltage, such as $V_{DD}$; the discharge section, or pull-down section discharges the node NX, or pulls the node down to $V_{SS}$. The compare circuit can include a pull-up section for driving a gate voltage level control node, and a discharge section for discharging the gate voltage level control node, the discharge signal being provided at the gate voltage level control node. The single matchline transistor can have a gate terminal coupled to the gate voltage level control node for receiving the discharge signal. As will be described later in more detail, in embodiments of the present invention the pull-up section 106 can include a plurality of pull-up transistors connected between the node NX and $V_{DD}$, and the discharge section 108 can include a plurality of discharge transistors connected between the node NX and $V_{SS}$.

Explained another way, the general embodiment described in FIG. 4 includes a single device coupled between the ML and TL for coupling a voltage of the matchline to the tail-line, thereby reducing or minimizing the ML capacitance and increasing the current. As discussed previously, the ML capacitance is composed of the capacitance of the matchline metal track, as well as the capacitance of any devices connected to ML. Since the capacitance of the matchline metal track is always present in any alternative approaches, differences in the remaining capacitance contributed by the devices should be considered. In the case illustrated in FIG. 4, the remaining ML capacitance is the capacitance of the single device as opposed to the capacitance of multiple devices in conventional CAM cells.

In CAM core, transistors tend to have minimum width W and length L, i.e. they tend to occupy minimum area. Taking only first order effects into account, L may be kept to a minimum determined by technology, since decreasing L has two positive effects: the current increases; and the transistor's gate-source and gate-drain capacitance decreases. Keeping L minimum will also have three negative effects: transistor drain impedance decreases; transistor source-drain capacitance increases; and source-drain leakage current increases. Similarly, keeping W to a minimum will have a positive effect (all capacitance components of the transistor decrease) and a negative effect (the current decreases). All these effects do not have critical influence on performance of the transistors in pull-up and discharge sections of the cell. Therefore W and L for these transistors tend to be minimum.

For the matchline transistors, however, the influence of these effects is crucial. For this reason, W and L for matchline transistors often has to be optimised. The optimum dimensions will be determined by process characteristics rather than by schematic implementation. It is to be understood that in all embodiments described herein, dimensions of pull-up and pull-down transistors as a rule will be a minimum determined by process restrictions and the matchline transistor sizes will have the same tendency for all schematic implementations of CAM cell in the same process. Therefore, difference in silicon area occupied by two CAM cells implemented in the same process will be sooner determined by transistor count than by transistor dimensions.

Figure 3A:
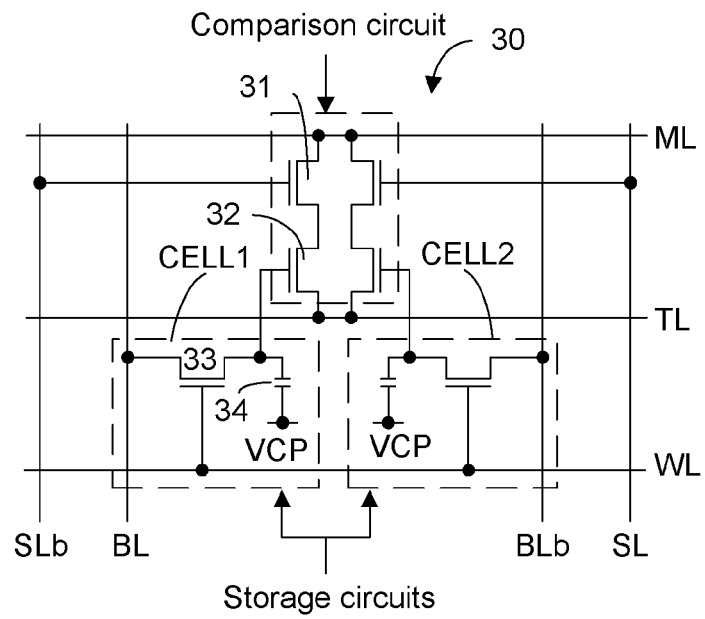
FIG. 3A illustrates a conventional basic ternary CAM cell using DRAM memory cells.
Figure 3B:
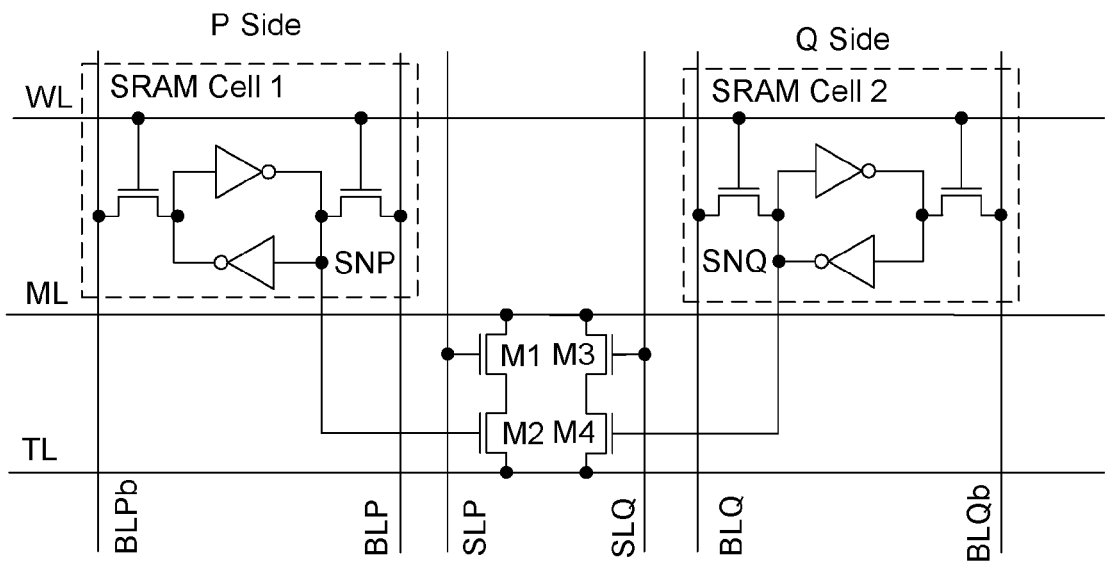
FIG. 3B illustrates a conventional basic ternary CAM cell using SRAM memory cells.

In the prior art, ternary CAM cells have generally been provided such that a lower current travels through the devices coupled to the matchline (such as M1, M2, M3 and M4 in FIG. 3B). Moreover, this lower current comes together with higher capacitance. Embodiments of the present invention, on the other hand, seek to minimize capacitance, while increasing the current through the device coupled to the matchline. Suppose prior art ternary CAM cell arrangements are defined in terms of current and capacitance units. Next, consider each transistor directly or indirectly connected to ML as contributing 1 conventional unit of capacitance (2 transistors-2 units respectively). Having 1 transistor between 2 lines (or one line and ground) as in embodiments of the present invention will draw 1 unit of current, whereas 2 transistors in series as in the prior art will draw only ½ unit of current. A goal of the design of the present invention is to increase the current and decrease the capacitance, while trying to keep number of transistors as small as possible and conserve chip area. This in turn will result in ML sensing speed increase without additional silicon area or power consumption.

Figure 5:
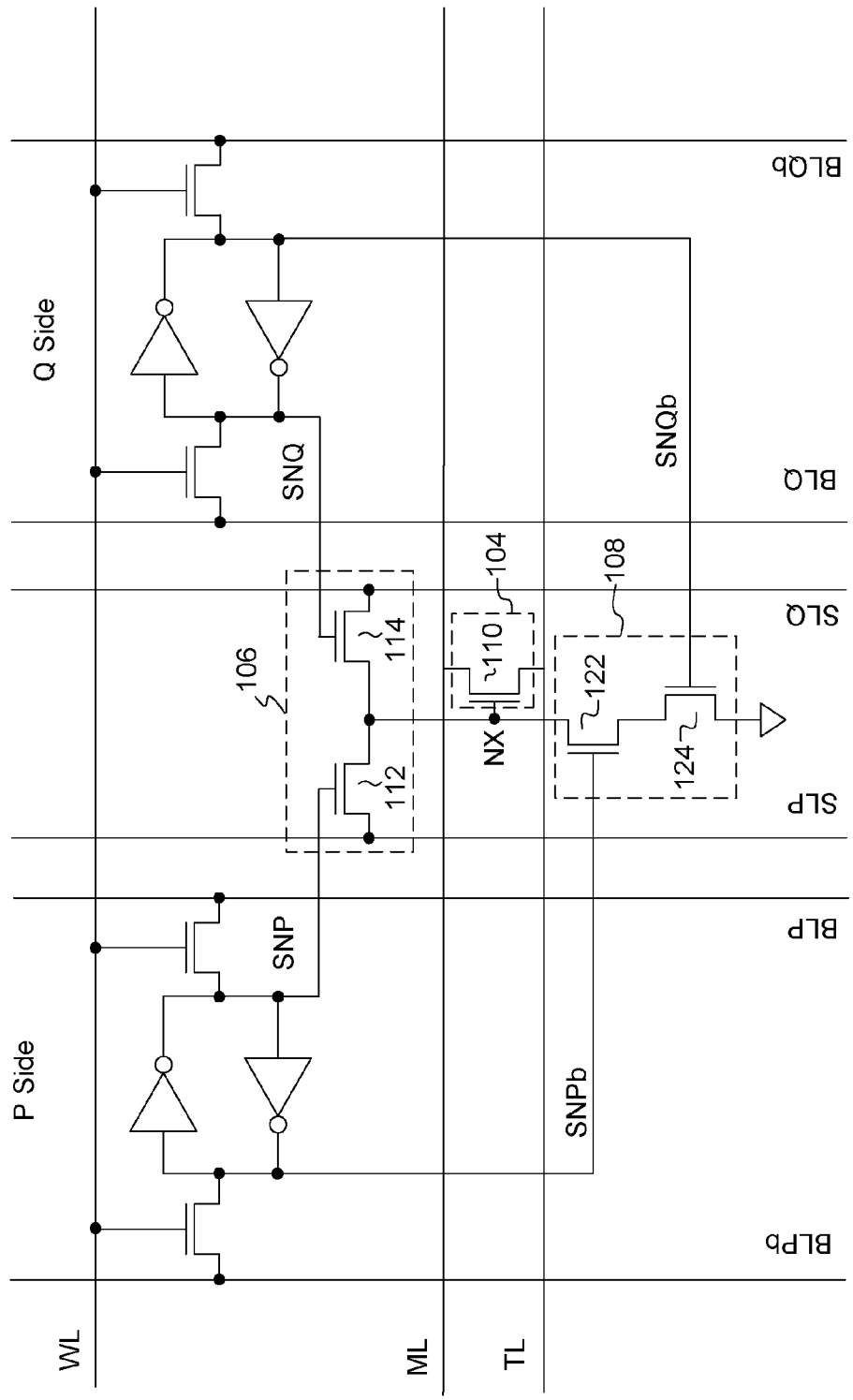
FIG. 5 illustrates a ternary CAM cell having reduced ML capacitance according to an embodiment of the present invention.

FIG. 5 illustrates a ternary CAM cell having reduced ML capacitance according to an embodiment of the present invention. The single matchline transistor 104 is a single n-type device 110, and has a drain terminal coupled to the matchline, and a source terminal coupled to the tail-line. The n-type transistor 110 turns on in the case of a mismatch between stored data and search line data. The gate voltage level control node, or node NX, is defined at the gate of the matchline transistor 104. The pull-up section 106 includes two n-type pull-up transistors 112 and 114, which are connected in parallel. The gate of the first n-type pull-up transistor 112 is provided with the SNP signal, while the drain is connected to SLP, and the source is connected to node NX. The gate of the second n-type pull-up transistor 114 is provided with the SNQ signal, while its drain is connected to SLQ, and its source is connected to node NX. The discharge section 108 includes two n-type discharge transistors 122 and 124, which are connected in series. The drain of the first n-type discharge transistor 122 is connected to node NX, while its gate is connected to the SNPb node, and its source is connected to the drain of the second n-type discharge transistor 124. The gate of the second n-type transistor 124 is connected to the SNQb signal, while its source is connected to $V_{SS}$. The gate voltage level control node, or node NX, can be described as a node located at the common drain/source terminals of transistors 112, 114 and 122.

During a search operation, data is applied to the search lines SLP and SLQ, and via the logic associated with 112, 114, 122 and 124, and results in the appropriate intermediate signal on node NX. If the stored data matches the search key, then a low voltage level will appear on NX resulting in a non-conductive path across the matchline transistor 110. If there is a mismatch, then the intermediate node NX goes high and there is a conductive path across transistor 110. Discharge transistors 122 and 124 are necessary since in the case of ternary "don't care" stored in the cell, low signals are applied to the gates of pull-up transistors 112 and 114 and without the pull-down section node NX is left floating. For this reason it is required that NX be pulled low via 122 and 124. In other words, whether a match has occurred can be detected based on whether there is a conductive or non-conductive path across the matchline transistor 110, which in turn is determined by the intermediate signal level appearing on node NX. The transistors 112 and 122 can be considered a search transistor and a compare transistor, respectively, for the P side of the cell. Similarly, the transistors 114 and 124 can be considered a search transistor and a compare transistor, respectively, for the Q side of the cell.

Explaining some aspects of the embodiment of FIG. 5 in another way, the pull-up section can include first and second n-type pull-up transistors, the first n-type pull-up transistor for coupling the first search line to the gate voltage level control node, and the second n-type pull-up transistor for coupling the second search line to the gate voltage level control node. The first n-type pull-up transistor can have a gate terminal for receiving stored data from the first memory cell, and the second n-type pull-up transistor can have a gate terminal for receiving stored data from the second memory cell. The discharge section can include first and second n-type discharge transistors connected to each other in series between the gate voltage level control node and a voltage supply, in which case the first n-type discharge transistor can have a gate terminal for receiving stored data from the first memory cell, and the second n-type discharge transistor can have a gate terminal for receiving stored data from the second memory cell.

In the embodiment illustrated in FIG. 5, data is stored in the cell using a write operation as in standard SRAM. Note that in this embodiment of the present invention information is used from both sides of the SRAM cell, as opposed to just one side that is used in the prior art. This can turn out to be an advantage since generally the more symmetric the cell, the better the noise immunity of the cell, and margins for read and write are better balanced. Note that although implementations are described in relation to SRAM memory cells, embodiments of the present invention can alternatively be implemented with DRAM memory cells, or any other suitable type of memory cell. In the implementation of FIG. 5, the current is maximised (1 unit as defined earlier) while the capacitance is minimized (also 1 unit), as compared with conventional implementations.

Comparing the prior art solution in FIG. 3B and one of the possible embodiments of the present invention in FIG. 5, one will notice that the prior art scheme might have up to 3 transistors connected to ML as the worst case. Transistors M1 and M3 connect directly and one of the M2 or M4 in case when SLP/SLQ carry ternary "1" or ternary "0" connect through conducting M1 or M3. This means that ML capacitance portion introduced by transistors in prior art scheme can be conventionally measured as 3 units. In the scheme FIG. 5 there is only one transistor connected to ML and therefore only 1 unit of capacitance is collected. Comparing currents, it is easy to see that in the prior art case it is only ½ unit as only one pair of serially connected transistors can conduct simultaneously (M1-M2 pair or M3-M4 pair). The scheme, or embodiment, in FIG. 5 for the present invention will be able to draw 1 unit of current as only one transistor is conducting between ML and TL, not a chain of transistors connected in series. Concluding the comparison is the fact that the scheme offered in present invention tends to have roughly 2 times higher current and 3 times less capacitance. Of course, this comes at the expense of higher transistor count: the new cell has 1 additional transistor. It does not necessarily mean however, that new cell will occupy more area. The prior art scheme has 4 matchline transistors while the new scheme has only 1 and those are devices with optimized, not necessarily minimum, W and L. Thus the new cell has 4 minimum sized devices and 1 non-minimum sized, potentially bigger device, whereas the prior art scheme has 4 bigger devices. The same approach may be used when comparing other prior art CAM cell schemes to other embodiments of the present invention.

The advantage of this design is that even though it requires one extra transistor over conventional ternary CAM cell designs, such as in FIG. 3B, the ML capacitance will now be significantly reduced since only one transistor is coupled to ML according to an embodiment of the present invention. Therefore, in addition to the capacitance of the matchline metal track, the remaining portion of ML capacitance is determined by the single matchline transistor 110 only, as opposed to the combination of four transistors in certain prior art implementations. By making 110 small it is possible to minimize the ML capacitance for a given process. Having a single device between the ML and TL is an improvement over having stacked devices.

Figure 2:
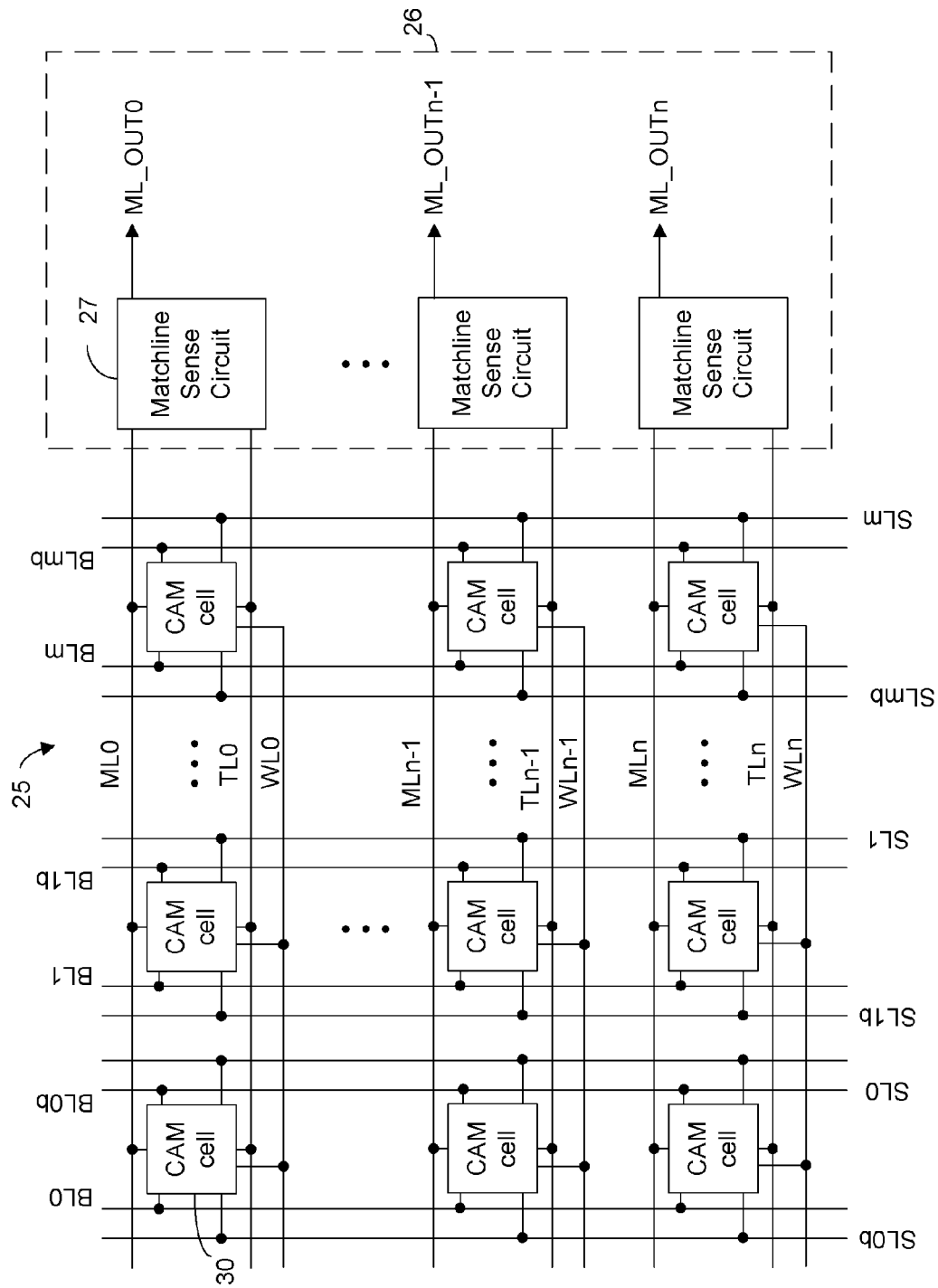
FIG. 2 illustrates a hierarchical view of a typical CAM array.

When implementing a plurality of ternary CAM cells as in FIG. 5, in a manner as illustrated in FIG. 2, it is possible that a phenomenon known as a weak "1" is observed at nodes NX of the cells. A weak "1" occurs when a plurality of ternary CAM cells share the SLP and SLQ lines. Since these cells are connected to search lines all in parallel, the search line drivers may become overloaded, and a voltage somewhat lower than $V_{DD}$ may be observed at the nodes NX of all the cells connected to the same search line. When a voltage level at node NX is less than $V_{DD}$, it can be described as a weak "1", as opposed to a strong "1" when a voltage level at node NX is $V_{DD}$. Some of the design variations in further embodiments will address the issue of the weak "1".

FIGS. 6 to 9 illustrate various embodiments of the present invention. Each alternative embodiment presents a different configuration for the pull-up and discharge sections. There is a different number of transistors in different implementations of the cell, and the number of PMOS and NMOS devices vary among implementations as well. The variations can make certain implementations more or less attractive for use with certain processes (e.g. in DRAM process it is often preferable to have only one type of the devices: PMOS or NMOS for higher density) The main implementation, shown in FIG. 5 has a minimum number of transistors; other implementations—according to design goals—have more transistors, but are able to provide a strong "1" signal, as it is sometimes desired. Note that in each of FIGS. 6 to 9, the SRAM cells are not shown in order to simplify the drawings, but the labelling of the nodes and signals corresponds to the labelling in FIG. 5. Although SRAM and DRAM memory cells are described herein, it is to be understood by one skilled in the art that any type of volatile or non-volativle memory can be used, such as EPROM, FLASH, etc.

Figure 6:
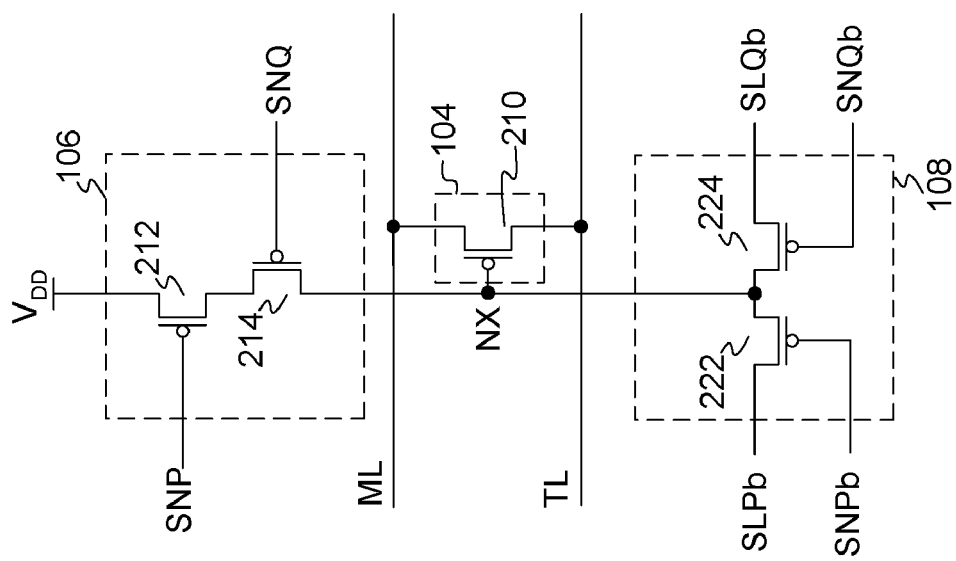
FIG. 6 illustrates a ternary CAM cell having reduced ML capacitance according to another embodiment of the present invention, using PMOS implementation.

FIG. 6 illustrates a ternary CAM cell having reduced ML capacitance according to another embodiment of the present invention, using a p-type, or PMOS, implementation. FIG. 6 can be considered as an inverted version of the cell of FIG. 5, implemented with p-channel transistors. In this implementation, the single matchline transistor 104 is a p-type device 210, with its source connected to ML and its drain to TL. The pull-up section 106 includes two p-type pull-up transistors 212 and 214 connected in series. The first p-type pull-up transistor 212 is connected to $V_{DD}$ supply at its source, to the SNP node at its gate, and to the source of the second p-type pull-up transistor 214 at its drain. The second p-type pull-up transistor 214 has its gate connected to the SNQ node, and its drain connected to node NX. The discharge section 108 includes two p-type discharge transistors 222 and 224 connected in parallel. The first p-type discharge transistor 222 is connected to node NX at its drain, and to SLPb at its source and SNPb at its gate. The second p-type discharge transistor 224 is connected to node NX at its drain, to SLQb at its source, and to SNQb at its gate.

Functionality of the embodiment, or scheme, in FIG. 6 can be understood using the truth table (Table 2) and keeping in mind that, similar to all other implementations, in case of match there must not be a conductive path between TL and ML while in case of mismatch a conductive path must exist. In case of ternary "don't care" stored in the cell, node NX may not be floating and this is what the pull-up section 106 is for. It is also important to note that SRAM cells load 1 balanced in this implementation just as in scheme FIG. 5. Generally, operation of the embodiment or scheme in FIG. 6 should be obvious to one skilled in the art.

Explaining the embodiment of FIG. 6 in another way, the single matchline transistor can be p-type and have a gate terminal coupled to the gate voltage level control node for receiving the discharge signal. The pull-up section can include first and second p-type pull-up transistors connected to each other in series between the gate voltage level control node and a voltage supply. The first p-type pull-up transistor can have a gate terminal for receiving stored data from the first memory cell, and the second p-type pull-up transistor can have a gate terminal for receiving stored data from the second memory cell. The discharge section can include first and second p-type discharge transistors, the first p-type discharge transistor for coupling the first search line to the gate voltage level control node, and the second p-type discharge transistor for coupling the second search line to the gate voltage level control node. The first p-type discharge transistor can have a gate terminal for receiving stored data from the first memory cell, and the second p-type discharge transistor has a gate terminal for receiving stored data from the second memory cell.

Figure 7:
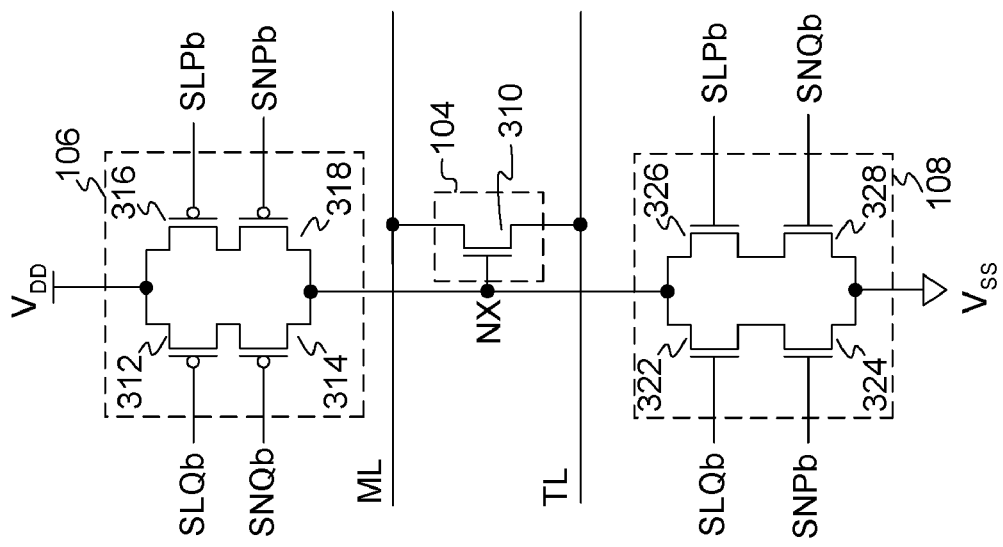
FIG. 7 illustrates a ternary CAM cell having reduced ML capacitance according to another embodiment of the present invention, using CMOS implementation.

FIG. 7 illustrates a ternary CAM cell having reduced ML capacitance according to another embodiment of the present invention, using a full CMOS gate implementation. This implementation provides a strong "1" at node NX, since the p-type device used provides full $V_{DD}$ voltage level to node NX, whereas the n-channel device of FIG. 5 connects node NX to search line at which voltage level might not be as high as $V_{DD}$ in case of search line driver overload. As a trade-off, the embodiment illustrated in FIG. 7 requires four extra transistors, as compared to the embodiment of FIG. 5. In FIG. 7, the single matchline transistor 104 is an n-type device 310. The pull-up section 106 includes four p-type pull-up transistors 312, 314, 316 and 318, which can collectively be referred to as a pull-up search stack with two branches. The first p-type pull-up transistor 312 is connected to $V_{DD}$ at its source, to SLQb at its gate, and its drain is connected to the source of the second p-type pull-up transistor 314. The second p-type pull-up transistor 314 has its gate connected to SNQb, and its drain connected to node NX. The third p-type pull-up transistor 316 is connected to $V_{DD}$ at its source, to SLPb at its gate, and its drain is connected to the source of the fourth p-type pull-up transistor 318. The fourth p-type pull-up transistor 318 has its gate connected to SNPb, and its drain connected to node NX.

The discharge section 108 of FIG. 7 includes four n-type discharge transistors 322, 324, 326 and 328, which can collectively be referred to as a pull-down or discharge search stack with two branches. The first n-type discharge transistor 322 is connected to node NX at its drain, to SLQb at its gate, and its source is connected to the drain of the second n-type discharge transistor 324. The second n-type discharge transistor 324 is connected to SNPb at its gate, and its source is connected to $V_{SS}$. The third n-type discharge transistor 326 is connected to node NX at its drain, to SLPb at its gate, and its source is connected to the drain of the fourth n-type discharge transistor 328. The fourth n-type discharge transistor 328 is connected to SNQb at its gate, and to $V_{SS}$ at its source.

Similarly to all previous implementation, operation of the embodiment, or scheme, in FIG. 7 is determined by logic of the same truth table (Table 2), reflecting the fact that in case of match transistor 310 does not conduct and in case of mismatch it does. Similarly, again, the pull-up section function is to prevent node NX from floating. Just as with all previous implementations, operation should be understood by one skilled in art.

Therefore, the embodiment of FIG. 7 can be described as a situation wherein the pull-up section can include a pull-up search stack having two branches, each branch for coupling the gate voltage level control node to a voltage supply. Each branch can include a pair of serially connected p-type transistors, where one branch receives, at gate terminals of the p-type transistors, data from the first search line and stored data from the first memory cell, and the other branch receives, at gate terminals of the p-type transistors, data from the second search line and stored data from the second memory cell. Also illustrated in the embodiment of FIG. 7, the discharge section can include a discharge search stack having two branches, each branch for coupling the gate voltage level control node to a voltage supply. Each branch can include a pair of serially connected n-type transistors, where one branch receives, at gate terminals of the n-type transistors, data from the second search line and stored data from the first memory cell, and the other branch receives, at gate terminals of the n-type transistors, data from the first search line and stored data from the second memory cell.

Figure 8:
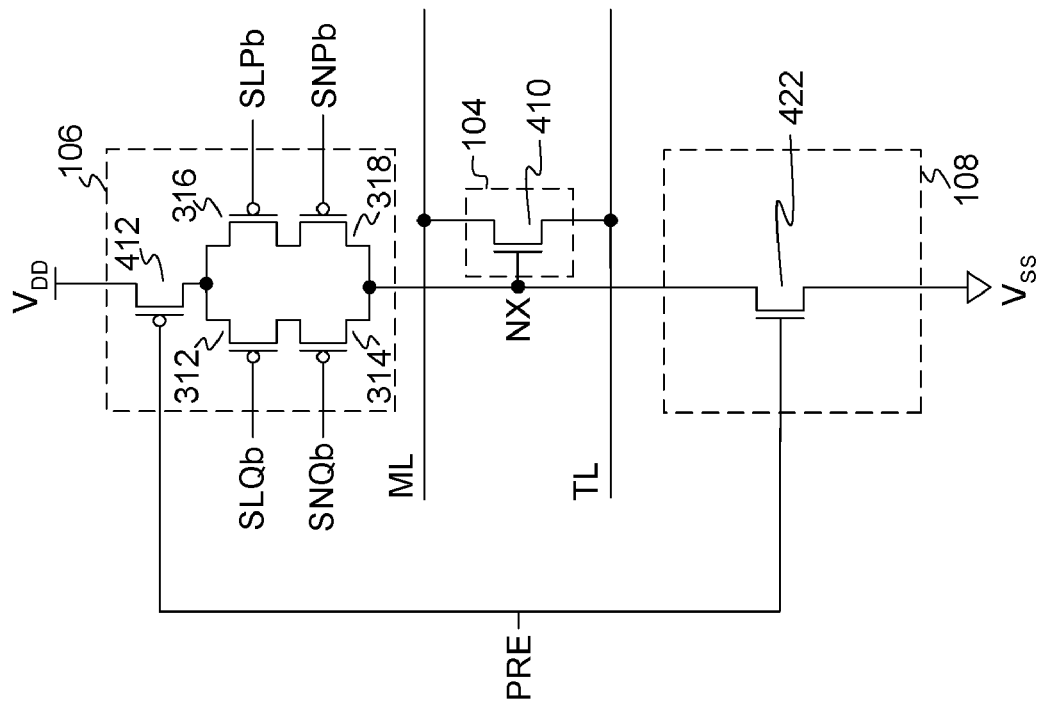
FIG. 8 illustrates a ternary CAM cell having reduced ML capacitance according to another embodiment of the present invention, using a CMOS implementation with pre-charge.

FIG. 8 illustrates a ternary CAM cell having reduced ML capacitance according to another embodiment of the present invention, using a CMOS gate implementation with pre-charge. This embodiment improves the design by reducing the transistor count in the CMOS implementation by providing a pre-charge gate circuitry. In FIG. 8, the single matchline transistor 104 is an n-type, or NMOS, device 410. The pull-up section 106 includes four PMOS, or p-type, pull-up transistors 312, 314, 316 and 318, as well as a pull-up pre-charge transistor 412. The pull-up pre-charge transistor 412, such as a p-type pre-charge transistor, has its source connected to $V_{DD}$, its gate connected to node PRE carrying pre-charge signal, and its drain connected to the source of the first p-type pull-up transistor 312. The pre-charge signal is a pulse, with logical value of "1" (high) in pre-charge phase or between search operations and logical value of "0" (low) during search operation when stored data is compared to the search key. The pulse has to have sufficient duration of both "1" and "0" phases so that node NX can be discharged completely to ground or puled completely up to $V_{DD}$. The first p-type pull-up transistor 312 is connected to SLQb at its gate, and its drain is connected to the source of the second p-type pull-up transistor 314. The second p-type pull-up transistor 314 has its gate connected to SNQb, and its drain connected to node NX. The third p-type pull-up transistor 316 is connected to the drain of the pre-charge pull-up transistor 412 at its source, to SLPb at its gate, and its drain is connected to the source of the fourth p-type pull-up transistor 318. The fourth p-type pull-up transistor 318 has its gate connected to SNPb, and its drain connected to node NX. In FIG. 8, the discharge section 108 includes a single n-type discharge transistor 422. The n-type discharge transistor 422 is connected to $V_{SS}$ at its source, to the PRE node at its gate, and its drain is connected to the NX node. Therefore, it can be said that in the embodiment of FIG. 8, the pull-up section further includes a pull-up pre-charge transistor for coupling the voltage supply to the pull-up search stack in response to a pre-charge signal.

The embodiment in FIG. 8 has less transistors than the previous embodiments in FIGS. 5-7. However, the embodiment in FIG. 8 needs a precharge phase in order to operate properly. The pre-charge transistor 412 in the pull-up section is required to cut off the pull-up section from $V_{DD}$ so it stays off and guarantees that it won't be able to pull the NX node up during the pre-charge phase. The pre-charge transistor 422 in the discharge section ensures that when signal comparison occurs in the pull-up section, node NX is released and can be pulled up if mismatch is detected. Then after the comparison is finished and ML signal level has been sensed by matchline sense amplifier, transistor 422 pulls node NX back down to $V_{SS}$ (pre-charges the NX node) preparing cell for the next search operation. The search key can be applied to gates of 312-316 during the precharge phase. Generally, operation of the embodiment or scheme in FIG. 8 should be obvious to one skilled in the art.

Figure 9:
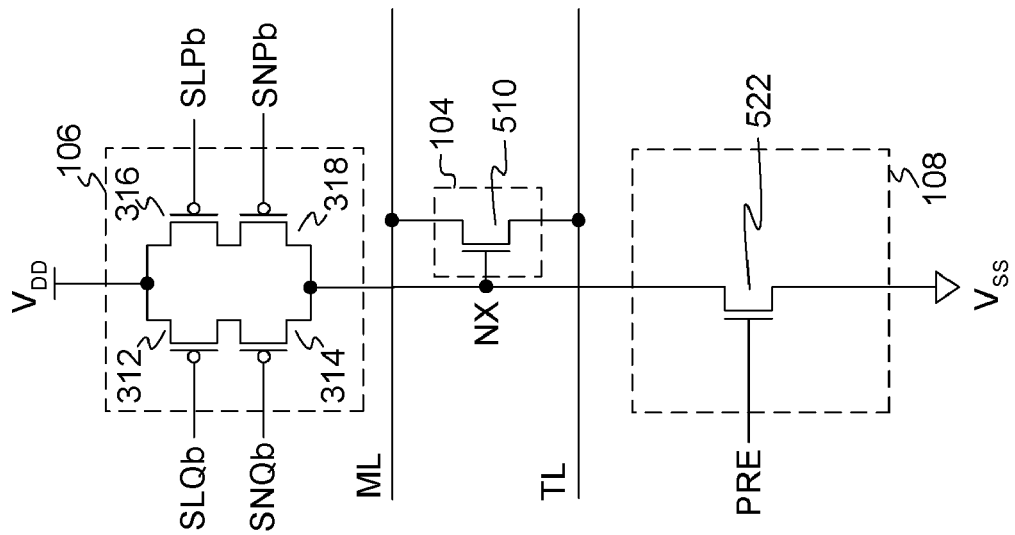
FIG. 9 illustrates a ternary CAM cell having reduced ML capacitance according to another embodiment of the present invention, using a CMOS implementation with simplified pre-charge.

FIG. 9 illustrates a ternary CAM cell having reduced ML capacitance according to another embodiment of the present invention, using a CMOS gate scheme with simplified pre-charge. In this embodiment, the p-type pre-charge transistor is eliminated from the design, further reducing the transistor count. Note that the SLPb and SLQb have to be held high during pre-charge in this architecture, resulting in slightly higher SL power consumption.

In FIG. 9, the single matchline transistor 104 is an n-type matchline transistor 510. The pull-up section 106 includes four p-type pull-up transistors 512, 514, 516 and 518. The p-type pull-up transistors 312, 314, 316 and 318 correspond respectively to the similarly numbered p-type pull-up transistors of FIG. 7, and are arranged and connected in the same configuration. In FIG. 9, the discharge section 108 includes a single n-type discharge transistor 522. The n-type discharge transistor 522 is connected to $V_{SS}$ at its source, to the PRE node at its gate, and its drain is connected to NX node.

It can be seen that the embodiments of FIG. 7 and FIG. 9 each have a discharge section that includes a single discharge transistor for coupling the gate voltage level control node to a voltage supply in response to a pre-charge signal.

The embodiment in FIG. 9 has less transistors than the previous embodiments in FIGS. 5-7, and even has one less transistor than the embodiment in FIG. 8. However, it still needs a precharge phase in order to operate properly, so it will require a somewhat more complex timing for the search operation control compare to the embodiments of FIGS. 5-7. Generally, operation of the embodiment or scheme in FIG. 9 should be obvious to one skilled in the art.

It has already been described that the embodiment of FIG. 6 is essentially an inverted implementation of the embodiment of FIG. 5 using p-type devices instead of n-type devices. It is to be understood by one of skill in the art that similar inversions can be made to the other embodiments described herein, such as in FIGS. 7-9, as well as to equivalents thereof.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A compare circuit for a content addressable memory cell coupled to first and second search lines comprising:
   a matchline transistor for coupling a matchline to a tail-line in response to a mismatch condition between the first and second search lines and data stored in the content addressable memory cell; and
   a discharge circuit for discharging a gate of the matchline transistor.

2. The compare circuit of claim 1, further including a pull-up section for coupling a gate voltage to the gate of the matchline transistor in response to the mismatch condition.

3. The compare circuit of claim 2 wherein the matchline transistor is n-type and has a drain terminal coupled to the matchline, and a source terminal coupled to the tail-line.

4. The compare circuit of claim 3 wherein the pull-up section includes first and second n-type pull-up transistors, the first n-type pull-up transistor for coupling the first search line to the gate of the matchline transistor, and the second n-type pull-up transistor for coupling the second search line to the gate of the matchline transistor.

5. The compare circuit of claim 4 wherein the first n-type pull-up transistor has a gate terminal for receiving stored data from a first memory cell, and the second n-type pull-up transistor has a gate terminal for receiving stored data from a second memory cell.

6. The compare circuit of claim 3 wherein the discharge circuit includes first and second n-type discharge transistors connected to each other in series between the gate of the matchline transistor and a voltage supply.

7. The compare circuit of claim 6 wherein the first n-type discharge transistor has a gate terminal for receiving stored data from a first memory cell, and the second n-type discharge transistor has a gate terminal for receiving stored data from a second memory cell.

8. The compare circuit of claim 3 wherein the pull-up section includes a pull-up search stack having two branches, each branch for coupling the gate of the matchline transistor to a voltage supply.

9. The compare circuit of claim 8 wherein each branch includes a pair of serially connected p-type transistors, and one branch receives, at gate terminals of the p-type transistors, data from the first search line and stored data from a first memory cell, and the other branch receives, at gate terminals of the p-type transistors, data from the second search line and stored data from a second memory cell.

10. The compare circuit of claim 8 wherein the pull-up section further includes a pull-up pre-charge transistor for coupling the voltage supply to the pull-up search stack in response to a pre-charge signal.

11. The compare circuit of claim 3 wherein the discharge circuit includes a discharge search stack having two branches, each branch for coupling the gate of the matchline transistor to a voltage supply.

12. The compare circuit of claim 11 wherein each branch includes a pair of serially connected n-type transistors, and one branch receives, at gate terminals of the n-type transistors, data from the second search line and stored data from a first memory cell, and the other branch receives, at gate terminals of the n-type transistors, data from the first search line and stored data from a second memory cell.

13. The compare circuit of claim 3 wherein the discharge circuit includes a discharge transistor for coupling the gate of the matchline transistor to a voltage supply in response to a pre-charge signal.

14. The compare circuit of claim 2 wherein the matchline transistor is p-type.

15. The compare circuit of claim 14 wherein the pull-up section includes first and second p-type pull-up transistors connected to each other in series between the gate of the matchline transistor and a voltage supply.

16. The compare circuit of claim 15 wherein the first p-type pull-up transistor has a gate terminal for receiving stored data from a first memory cell, and the second p-type pull-up transistor has a gate terminal for receiving stored data from a second memory cell.

17. The compare circuit of claim 14 wherein the discharge section includes first and second p-type discharge transistors, the first p-type discharge transistor for coupling the first search line to the gate of the matchline transistor, and the second p-type discharge transistor for coupling the second search line to the gate of the matchline transistor.

18. The compare circuit of claim 17 wherein the first p-type discharge transistor has a gate terminal for receiving stored data from a first memory cell, and the second p-type discharge transistor has a gate terminal for receiving stored data from a second memory cell.

19. A compare circuit for a content addressable memory cell coupled to first and second search lines comprising:
a matchline transistor for coupling a matchline to a tail-line in response to a discharge signal, the matchline transistor having a gate for receiving the discharge signal when the first and second search lines mismatch data stored in the content addressable memory cell; and
a discharge circuit for discharging the gate of the matchline transistor.

20. The compare circuit of claim 19, further including a pull-up section for providing the discharge signal in response to the mismatch condition.

21. The compare circuit of claim 20 wherein the matchline transistor is n-type and has a drain terminal coupled to the matchline, and a source terminal coupled to the tail-line.

22. The compare circuit of claim 21 wherein the pull-up section includes first and second n-type pull-up transistors, the first n-type pull-up transistor for coupling the first search line to the gate of the matchline transistor, and the second n-type pull-up transistor for coupling the second search line to the gate of the matchline transistor, the discharge signal being provided from one of the first search line and the second search line.

23. The compare circuit of claim 22 wherein the first n-type pull-up transistor has a gate terminal for receiving stored data from a first memory cell, and the second n-type pull-up transistor has a gate terminal for receiving stored data from a second memory cell.

24. The compare circuit of claim 21 wherein the discharge circuit includes first and second n-type discharge transistors connected to each other in series between the gate of the matchline transistor and a voltage supply.

25. The compare circuit of claim 24 wherein the first n-type discharge transistor has a gate terminal for receiving stored data from a first memory cell, and the second n-type discharge transistor has a gate terminal for receiving stored data from a second memory cell.

26. The compare circuit of claim 21 wherein the pull-up section includes a pull-up search stack having two branches, each branch for coupling the gate of the matchline transistor to a voltage supply, the voltage supply corresponding to the discharge signal.

27. The compare circuit of claim 26 wherein each branch includes a pair of serially connected p-type transistors, and one branch receives, at gate terminals of the p-type transistors, data from the first search line and stored data from a first memory cell, and the other branch receives, at gate terminals of the p-type transistors, data from the second search line and stored data from a second memory cell.

28. The compare circuit of claim 26 wherein the pull-up section further includes a pull-up pre-charge transistor for coupling the voltage supply to the pull-up search stack in response to a pre-charge signal, the voltage supply corresponding to the discharge signal.

29. The compare circuit of claim 21 wherein the discharge circuit includes a discharge search stack having two branches, each branch for coupling the gate of the matchline transistor to a voltage supply, the voltage supply corresponding to the discharge signal.

30. The compare circuit of claim 29 wherein each branch includes a pair of serially connected n-type transistors, and one branch receives, at gate terminals of the n-type transistors, data from the second search line and stored data from a first memory cell, and the other branch receives, at gate terminals of the n-type transistors, data from the first search line and stored data from a second memory cell.

31. The compare circuit of claim 21 wherein the discharge circuit includes a discharge transistor for coupling the gate of the matchline transistor to a voltage supply in response to a pre-charge signal, the voltage supply corresponding to the discharge signal.

32. The compare circuit of claim 20 wherein the matchline transistor is p-type.

33. The compare circuit of claim 32 wherein the pull-up section includes first and second p-type pull-up transistors connected to each other in series between the gate of the matchline transistor and a voltage supply, the voltage supply corresponding to the discharge signal.

34. The compare circuit of claim 33 wherein the first p-type pull-up transistor has a gate terminal for receiving stored data from a first memory cell, and the second p-type pull-up transistor has a gate terminal for receiving stored data from a second memory cell.

35. The compare circuit of claim 32 wherein the discharge section includes first and second p-type discharge transistors, the first p-type discharge transistor for coupling the first search line to the gate of the matchline transistor, and the second p-type discharge transistor for coupling the second search line to the gate of the matchline transistor, the discharge signal being provided from one of the first search line and the second search line.

36. The compare circuit of claim 35 wherein the first p-type discharge transistor has a gate terminal for receiving stored data from a first memory cell, and the second p-type discharge transistor has a gate terminal for receiving stored data from a second memory cell.

* * * * *